United States Patent
Xiang et al.

(10) Patent No.: US 9,504,185 B2
(45) Date of Patent: Nov. 22, 2016

(54) DUAL CHAMBER LOOP HEAT PIPE STRUCTURE WITH MULTIPLE WICK LAYERS

(75) Inventors: Jun Xiang, Shenzhen (CN);
Xiao-Xiang Zhou, Shenzhen (CN);
Kuei-Feng Chiang, Shenzhen (CN)

(73) Assignee: Asia Vital Components (Shen Zhen) Co., Ltd., Shenzhen (CN)

( * ) Notice: Subject to any disclaimer, the term of this patent is extended or adjusted under 35 U.S.C. 154(b) by 752 days.

(21) Appl. No.: 13/179,567

(22) Filed: Jul. 11, 2011

(65) Prior Publication Data

US 2012/0247736 A1    Oct. 4, 2012

(30) Foreign Application Priority Data

Mar. 29, 2011    (CN) .......................... 2011 1 0076381

(51) Int. Cl.
*F28D 15/00* (2006.01)
*H05K 7/20* (2006.01)
*H01L 23/427* (2006.01)
(Continued)

(52) U.S. Cl.
CPC ....... *H05K 7/20336* (2013.01); *F28D 15/0266* (2013.01); *F28D 15/0275* (2013.01); *F28D 15/046* (2013.01); *H01L 23/427* (2013.01); *H01L 2924/0002* (2013.01)

(58) Field of Classification Search
CPC ... H01L 23/427; H01L 23/467; H01L 24/72; F28D 15/0266; F28D 15/046; F28D 15/0233; H05K 7/20309; H05K 7/20336
USPC ......... 165/104.26, 104.33; 361/700; 257/715
See application file for complete search history.

(56) References Cited

U.S. PATENT DOCUMENTS

| | | | | |
|---|---|---|---|---|
| 5,944,092 A | * | 8/1999 | Van Oost | .................. 165/104.26 |
| 6,227,287 B1 | * | 5/2001 | Tanaka et al. | ............... 165/80.4 |
| 7,420,810 B2 | * | 9/2008 | Reis et al. | ..................... 361/707 |

(Continued)

FOREIGN PATENT DOCUMENTS

| | | |
|---|---|---|
| CN | 101478868 A | 7/2009 |
| CN | 101793472 A | 8/2010 |

(Continued)

OTHER PUBLICATIONS

Witts et al. reference obtained by accessing the following website on Mar. 18, 2014 http://www.eurotherm2008.tue.nl/Proceedings_Eurotherm2008/papers/Two-phase_Flow/TPF_8.pdf.*

(Continued)

*Primary Examiner* — Len Tran
*Assistant Examiner* — Gordon Jones
(74) *Attorney, Agent, or Firm* — C. G. Mersereau; Nikolai & Mersereau, P.A.

(57) ABSTRACT

A loop heat pipe structure includes a transport pipe, an evaporator, a first wick layer, a second wick layer, and a plurality of grooves. The transport pipe communicates with the evaporator. The evaporator has a bottom and internally defines a first chamber and a second chamber, and has a working fluid filled therein. The first wick layer is located on the bottom, and the second wick layer is located on and covers the first wick layer. The grooves can be selectively provided on the first wick layer or the bottom. The first and second wick layers are so designed that the situation of very high vapor pressure would not occur in the second chamber, enabling the loop heat pipe structure to have upgraded heat dissipation efficiency.

9 Claims, 10 Drawing Sheets

(51) Int. Cl.
*F28D 15/02* (2006.01)
*F28D 15/04* (2006.01)

(56) References Cited

U.S. PATENT DOCUMENTS

| | | | |
|---|---|---|---|
| 7,931,072 B1* | 4/2011 | Kroliczek et al. | 165/104.26 |
| 8,109,325 B2* | 2/2012 | Kroliczek et al. | 165/104.21 |
| 2002/0007937 A1* | 1/2002 | Kroliczek et al. | 165/104.26 |
| 2003/0042009 A1 | 3/2003 | Phillips et al. | |
| 2007/0267180 A1* | 11/2007 | Asfia et al. | 165/104.26 |
| 2008/0128898 A1* | 6/2008 | Henderson et al. | 257/713 |
| 2008/0283223 A1* | 11/2008 | Chang et al. | 165/104.26 |
| 2009/0032226 A1* | 2/2009 | Huang et al. | 165/104.26 |
| 2009/0164010 A1* | 6/2009 | Steinhardt et al. | 623/10 |
| 2009/0314472 A1 | 12/2009 | Kim et al. | |
| 2010/0163212 A1* | 7/2010 | Chin | 165/104.26 |
| 2012/0043060 A1* | 2/2012 | Wang et al. | 165/104.26 |

FOREIGN PATENT DOCUMENTS

| | | | |
|---|---|---|---|
| JP | 2003214779 A | * | 7/2003 |
| TW | 200829852 A | | 7/2008 |
| TW | 200909989 A | | 3/2009 |
| TW | 200940938 A | | 10/2009 |
| TW | 201028635 A | | 8/2010 |
| TW | I333539 B | | 11/2010 |
| TW | 201104202 A | | 2/2011 |
| TW | I366626 B | | 6/2012 |

OTHER PUBLICATIONS

Lalit M Monocha reference: S̄adhan̄a vol. 28, Parts 1 & 2, Feb./Apr. 2003, pp. 349-358. © Printed in India.*

Hai-Ying Zhou, Dissertation entitled: Flat Loop Heat Pipe Experimental Research, Jul. 2, 2007, Jun. 1, 2006, 3 pages.

* cited by examiner

DUAL CHAMBER LOOP HEAT PIPE STRUCTURE WITH MULTIPLE WICK LAYERS

This application claims the priority benefit of China patent application number 201110076381.8. filed on Mar. 29, 2011.

FIELD OF THE INVENTION

The present invention relates to a loop heat pipe structure, and more particularly to a loop heat pipe structure that includes an evaporator internally provided with superposed wick layers having different thermal conductivity and permeability to thereby avoid very high vapor pressure in the evaporator and enable upgraded overall heat dissipation efficiency.

BACKGROUND OF THE INVENTION

Due to the progress in the semiconductor technology, integrated circuit (IC) chips have been widely used in various electronic apparatus, such as personal computers, notebook computers and network servers. While the IC chips have significantly increased computing speed and functions, they also generate correspondingly increased waste heat. Such waste heat must be effectively removed to protect the electronic apparatus against failure. Various heat dissipation means are therefore developed to achieve effective removal of the heat generated by the IC chips.

One of the heat dissipation means is loop heat pipe (LHP). In a conventional loop heat pipe structure, there is included a reservoir or a compensation chamber for storing an adequate amount of working fluid, so that the evaporator for the loop heat pipe structure can be properly furnished with the working fluid and adapt to the volume change of the working fluid caused by density change thereof. The reservoir or compensation chamber also filters gas or bubbles in the working fluid, so that the working fluid is not interfered and damaged by the containing gas or bubbles.

While the conventional loop heat pipe structure provides a lot of advantages, it has a cylindrical evaporator that occupies a relatively large space and fails to directly contact with the heat source due to the round outer surface thereof. To overcome such disadvantages, a flat plate loop heat pipe (FPLHP) structure has been developed. The existing flat plate loop heat pipe structure has only type of wick structure provided in the evaporator thereof. With only one type of wick structure provided in the evaporator, heat that heats the evaporator can also easily enter into the reservoir or compensation chamber to cause serious heat leak. In the event a single layer of wick structure with low thermal conductivity is used to prevent the heat leak, another problem of relatively high local thermal resistance would occur in the evaporator. On the other hand, when a single layer of wick structure with high thermal conductivity is used, it would become very difficult to initialize the flat plate loop heat pipe structure. In other words, the flat plate loop heat pipe structure having one single layer of wick structure with high thermal conductivity requires an extremely high critical power for the initialization thereof and even could not be started up in some special working condition.

Moreover, the existing flat plate loop heat pipe structure usually has an evaporator made of only one type of material for both of its wall portions and bottom. However, the bottom of the evaporator in contact with the heat source should have higher thermal conductivity than the wall portions of the evaporation. Further, due to the special construction of the flat plate loop heat pipe structure, when the bottom of the evaporator is in contact with the heat source, the heat is also transferred via the wall portions of the evaporator to heat the working fluid in the reservoir or compensation chamber. In some cases, the amount of heat transferred to the reservoir or compensation chamber is even equal to that causing the heat leak via the wick structure in the evaporator. A combined effect of the above two conditions badly affects the thermal performance of the flat plate loop heat pipe structure to even offset the advantages thereof.

SUMMARY OF THE INVENTION

A primary object of the present invention is to provide a loop heat pipe structure that prevents heat leak to ensure good heat dissipation performance.

To achieve the above and other objects, the loop heat pipe structure according to the present invention includes a transport pipe, an evaporator, a first wick layer, a second wick layer, and a plurality of grooves. The transport pipe has a first end and a second end, and internally defines a flow passage communicating with the first and the second end. The evaporator internally defines a first chamber and a second chamber, has a bottom, and has a working fluid filled therein; the first chamber has a first coupling hole coupled with the first end of the transport pipe, the second chamber has a second coupling hole coupled with the second end of the transport pipe and is internally provided with a supporting post. The first wick layer is located atop the bottom; and the second wick layer is located atop and covers the first wick layer. The grooves are selectively provided on the first wick layer or the bottom of the evaporator.

The above-described first wick layer provides sufficient capillary force required by the whole loop heat pipe structure to work normally, and reduces the pressure loss caused by the movement of the working fluid through the first wick layer. The above-described second wick layer serves as a heat lock layer to effectively prevent the heat transferred to the first wick layer from entering into the second chamber to cause heat leak. That is, the working fluid will not be overheated to form vapor-liquid phase equilibrium and produce high saturation vapor pressure in the second chamber, allowing the liquid-phase working fluid in the transport pipe to return to the second chamber. Therefore, the loop heat pipe structure of the present invention can avoid the occurrence of very high vapor pressure in the evaporator and enable upgraded overall heat dissipation efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
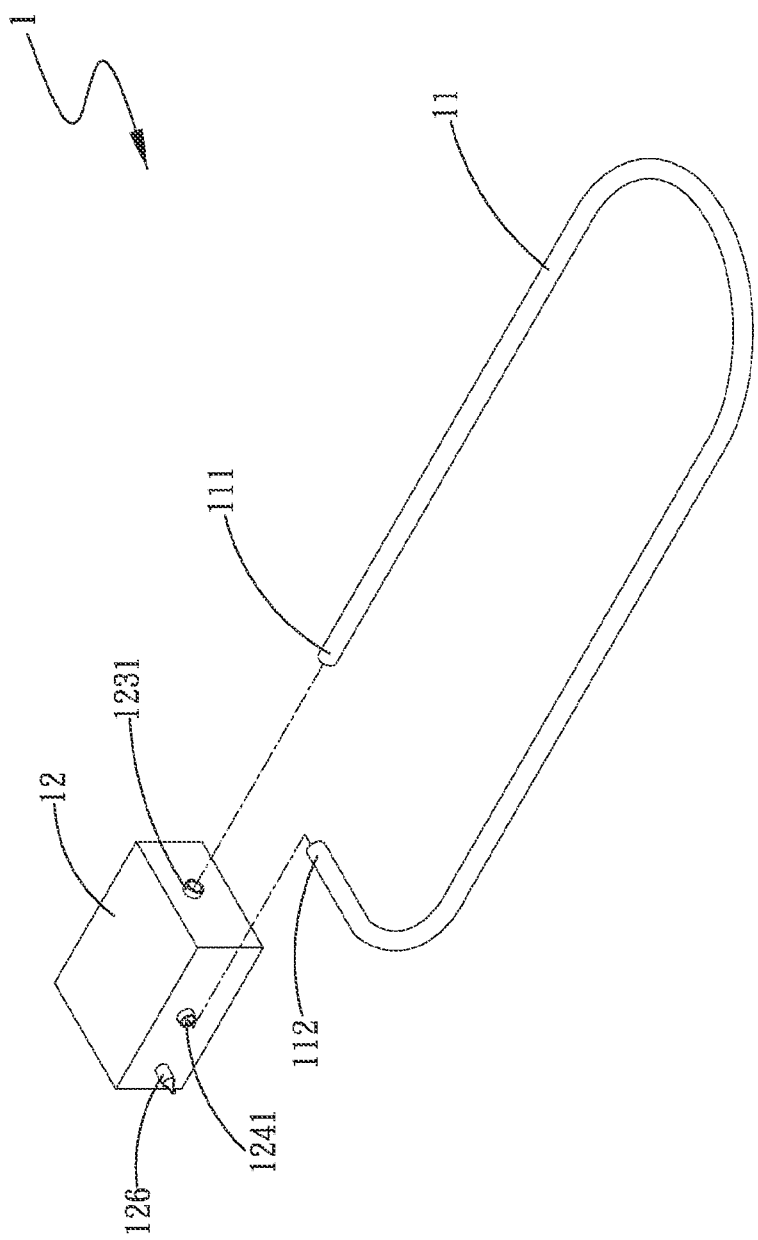
FIG. 1 is an exploded perspective view of a loop heat pipe structure according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
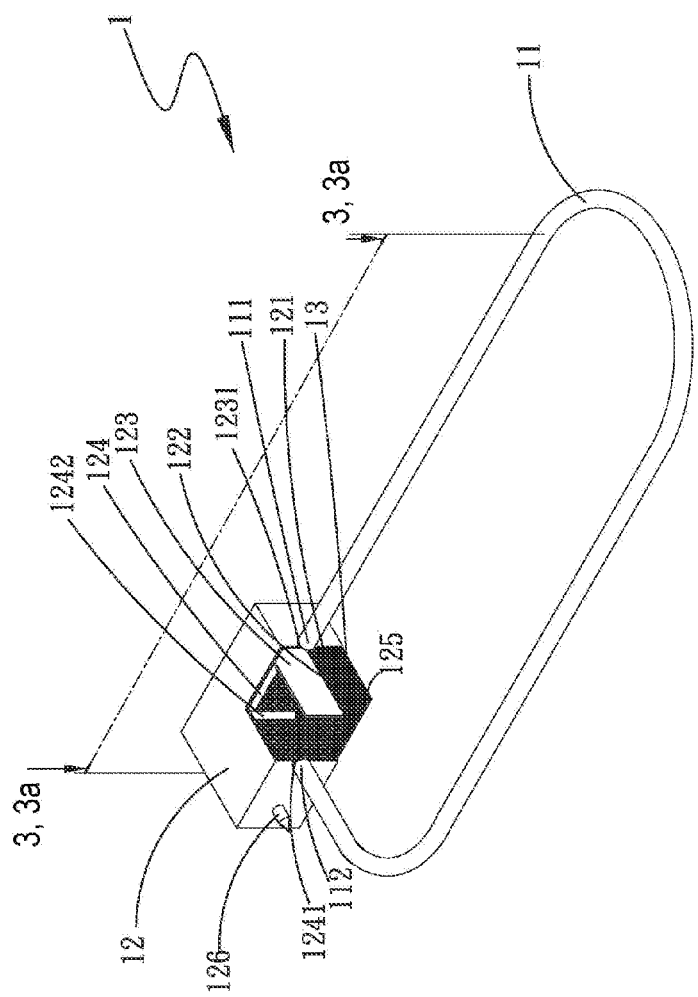
FIG. 2 is a cutaway view of the loop heat pipe structure according to the first embodiment of the present invention.
Figure 3:
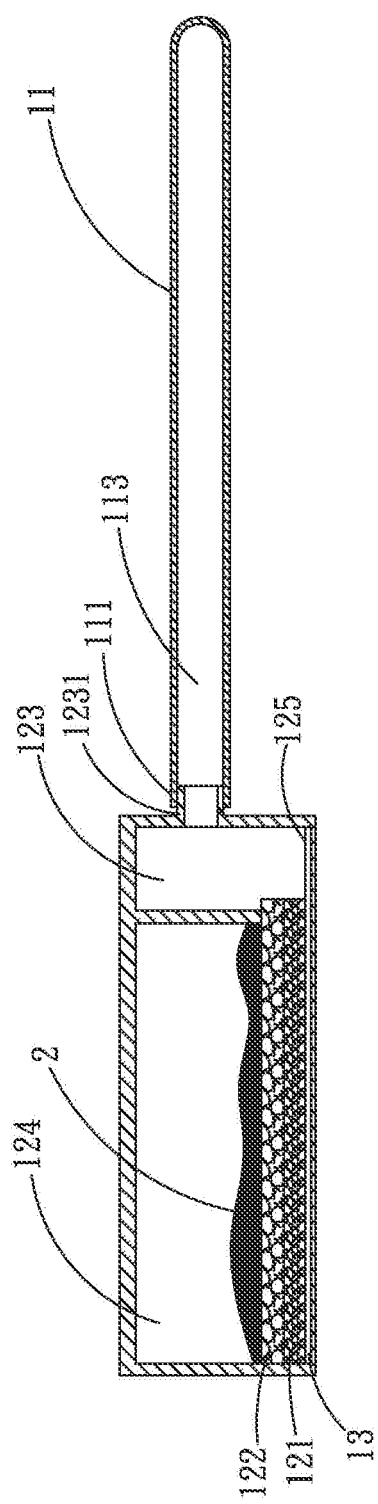
FIG. 3 is a sectional view taken along line 3-3 of FIG. 2.

Please refer to FIGS. 1 and 2 that are exploded perspective and cutaway views, respectively, of a loop heat pipe structure 1 according to a first embodiment of the present invention, and to FIG. 3 that is a sectional view taken along line 3-3 of FIG. 2. As shown, the loop heat pipe structure 1 in the first embodiment includes a transport pipe 11, an evaporator 12, a first wick layer 121, a second wick layer 122, and a plurality of grooves 13.

The transport pipe 11 has a first end 111 and a second end 112, and internally defines a flow passage 113 communicating with the first and the second end 111, 112.

The evaporator 12 has a bottom 125, internally defines a first chamber 123 and a second chamber 124, and has a working fluid 2 filled therein. The first chamber 123 is provided with a first coupling hole 1231. The second chamber 124 is provided with a second coupling hole 1241 and is internally provided with a supporting post 1242. The first and the second coupling hole 1231, 1241 are coupled with the first and the second end 111, 112 of the transport pipe 11, respectively.

The first wick layer 121 is located atop the bottom 125.

Figure 3A:
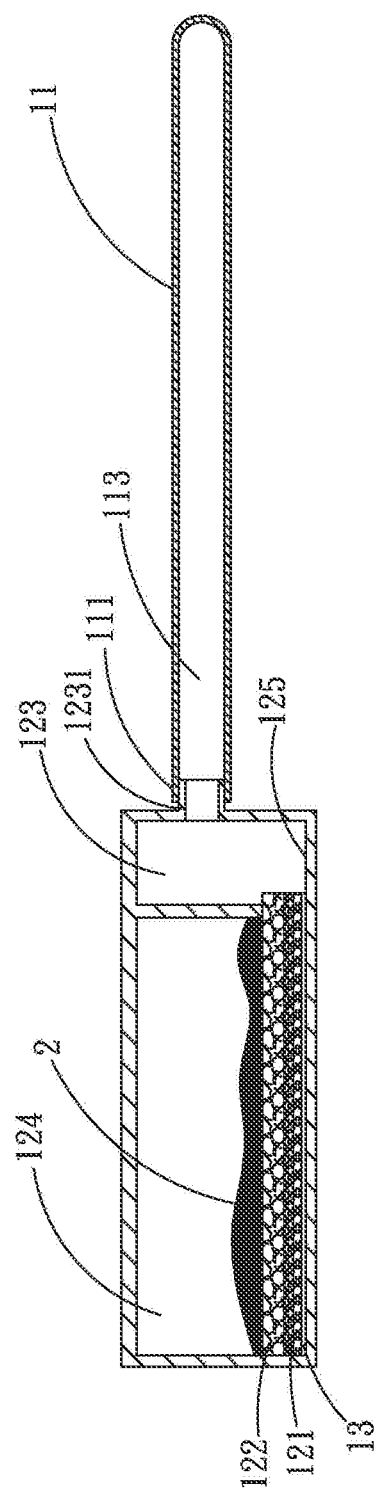
FIG. 3a. is another sectional view taken along line 3a-3a. of FIG. 2 according to a variant of the first embodiment of the present invention.

The second wick layer 122 is located atop and covers the first wick layer 121. While the first embodiment is illustrated with the grooves 13 provided on the bottom 125 as can be seen from FIG. 3, it is understood the grooves 13 can be selectively provided on any one of the first wick layer 121 and the bottom 125. For example, in a variant of the first embodiment as shown in FIG. 3a, the grooves 13 are provided on one side of the first wick layer 121.

While the first embodiment is illustrated with the first and second wick layers 121, 122 being a sintered powder body each, it is understood the first and the second wick layer 121, 122 can be any one of a sintered powder body, a net-like body, carbon fibers, and graphite.

The second wick layer 122 has permeability larger than that of the first wick layer 121, and has thermal conductivity smaller than that of the first wick layer 121.

The evaporator 12 includes a working pipe 126, which can be communicably provided on the first chamber 123 or the second chamber 124. While the first embodiment is illustrated with the working pipe 126 provided on and communicating with the second chamber 124, it is understood the working pipe 126 can be otherwise provided on and communicating with the first chamber 123. In the process of manufacturing the loop heat pipe structure 1 of the present invention, the evaporator 12 can be evacuated and filled with the working fluid 2 via the working pipe 126. Thereafter, an open end of the working pipe 126 is sealed.

Figure 4:
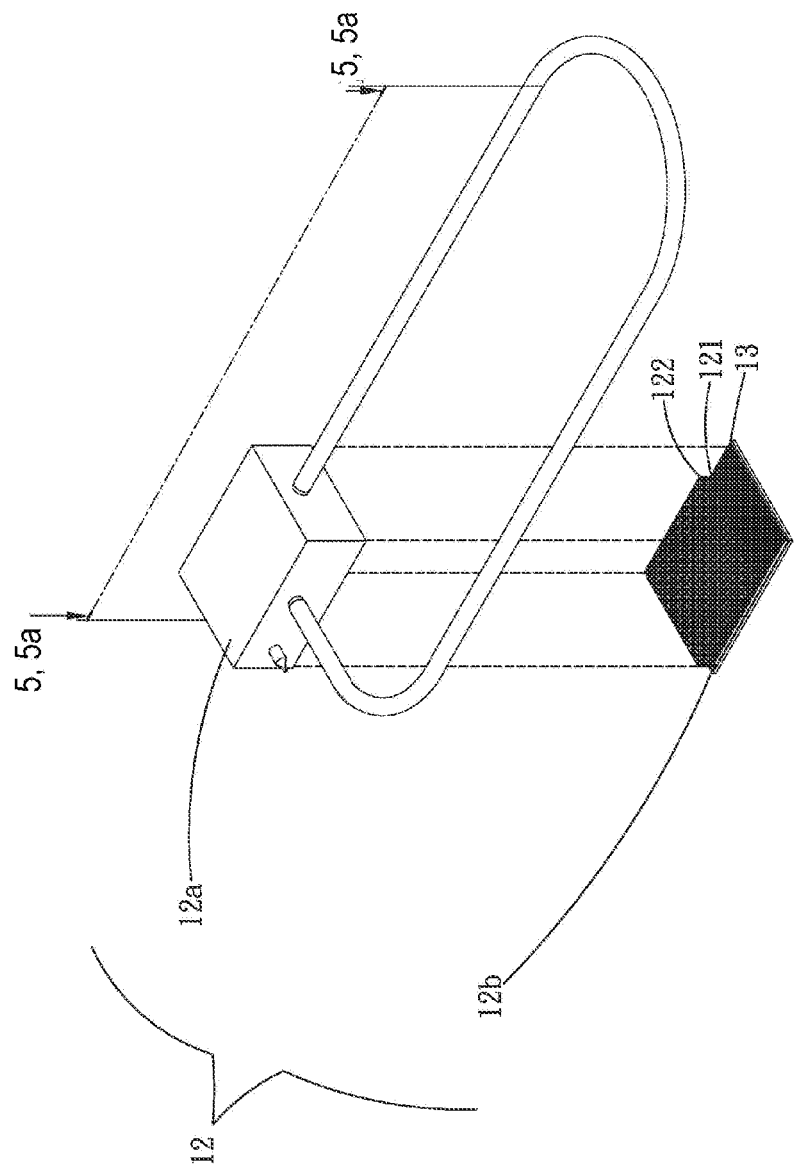
FIG. 4 is an exploded perspective view of a loop heat pipe structure according to a second embodiment of the present invention.
Figure 5:
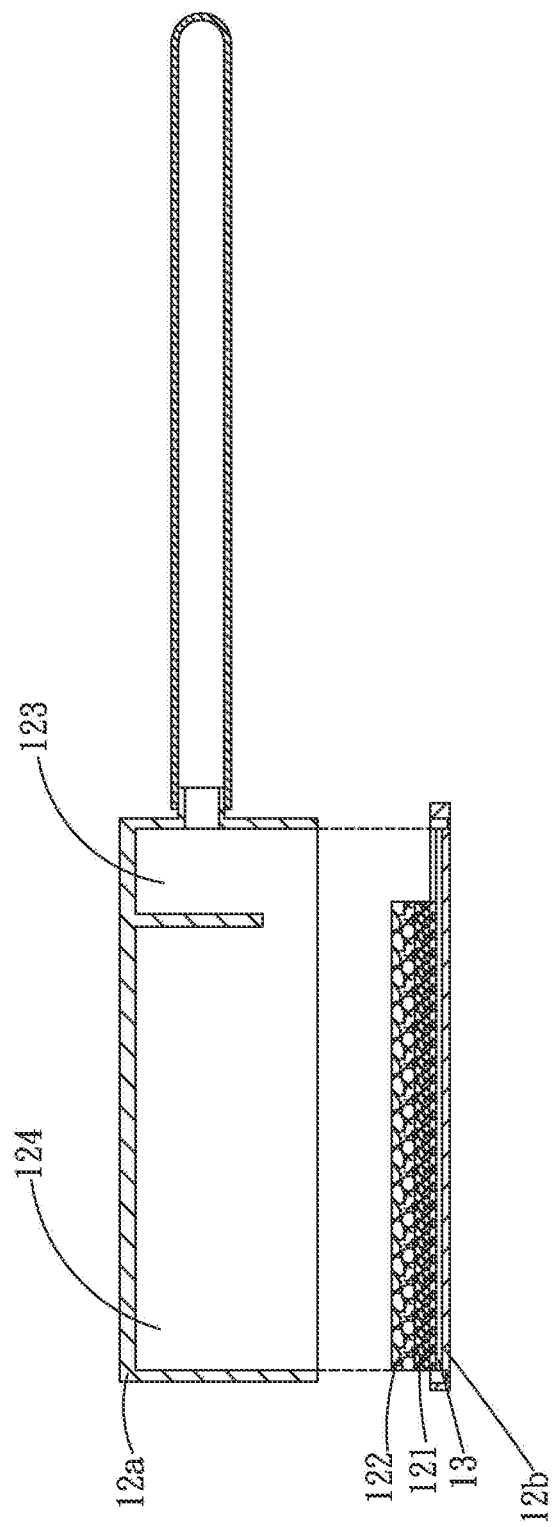
FIG. 5 is a sectional view taken along line 5-5 of FIG. 4.
Figure 5A:
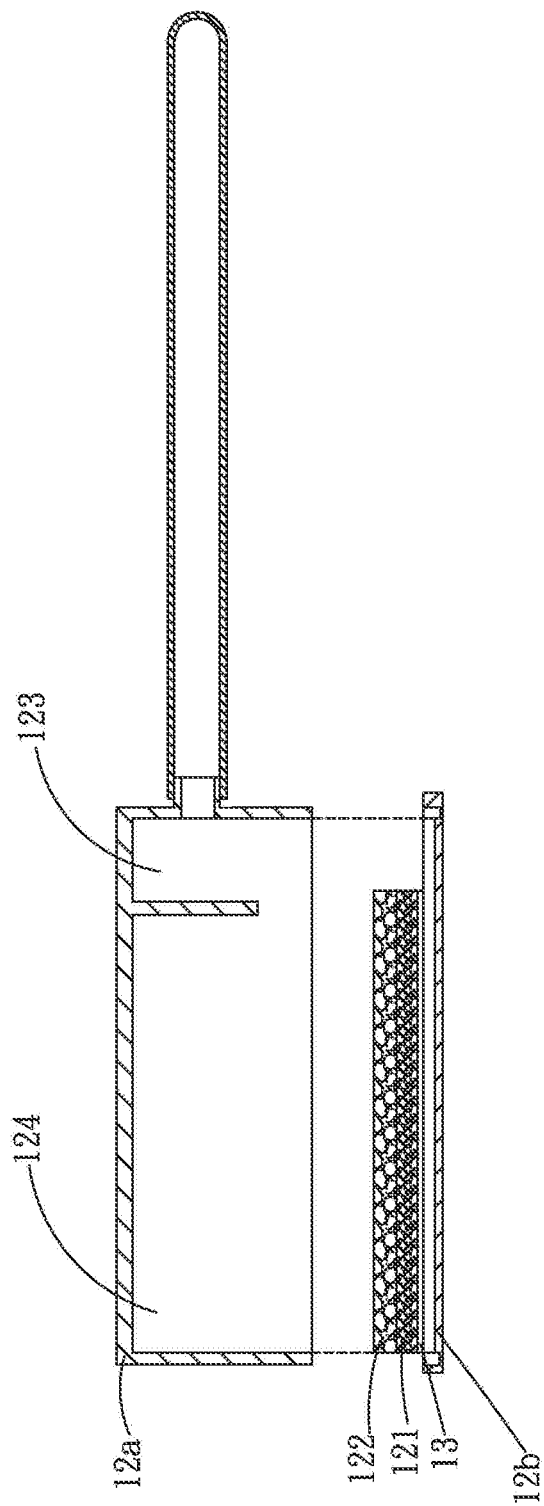
FIG. 5a. is another sectional view taken along line 5a-5a. of FIG. 4 according to a variant of the second embodiment of the present invention.

Please refer to FIG. 4 that is an exploded perspective view of a loop heat pipe structure according to a second embodiment of the present invention, and to FIG. 5 that is a sectional view taken along line 5a-5a. of FIG. 4. As shown, the second embodiment is generally structurally similar to the first embodiment, except that, in the second embodiment, the evaporator 12 includes a cover 12a. and a bottom plate 12b. correspondingly closed to each other to define the first and the second chamber 123, 124 therebetween. In the second embodiment, the first wick layer 121 is located atop the bottom plate 12band the second wick layer 122 is located atop the first wick layer 121. While the second embodiment is illustrated with the grooves 13 provided on the bottom plate 12bas can be seen from FIG. 5, it is understood the grooves 13 can be selectively provided on any one of the first wick layer 121 and the bottom plate 12b. For example, in a variant of the second embodiment as shown in FIG. 5a, the grooves 13 are provided on one side of the first wick layer 121.

In the illustrated second embodiment, the cover 12a. and the bottom plate 12b. are made of different materials. However, it is understood the cover 12a. and the bottom plate 12b. can be otherwise made of identical material. The cover 12a. can be made of a stainless steel material, a carbon steel material, or a polymeric material. In the illustrated second embodiment, the cover 12a. is made of a material having low thermal conductivity and compatible with the working fluid 2, including but not limited to a stainless steel material; and the bottom plate 12b. is made of a metal material having high thermal conductivity, such as a copper material.

Figure 6:
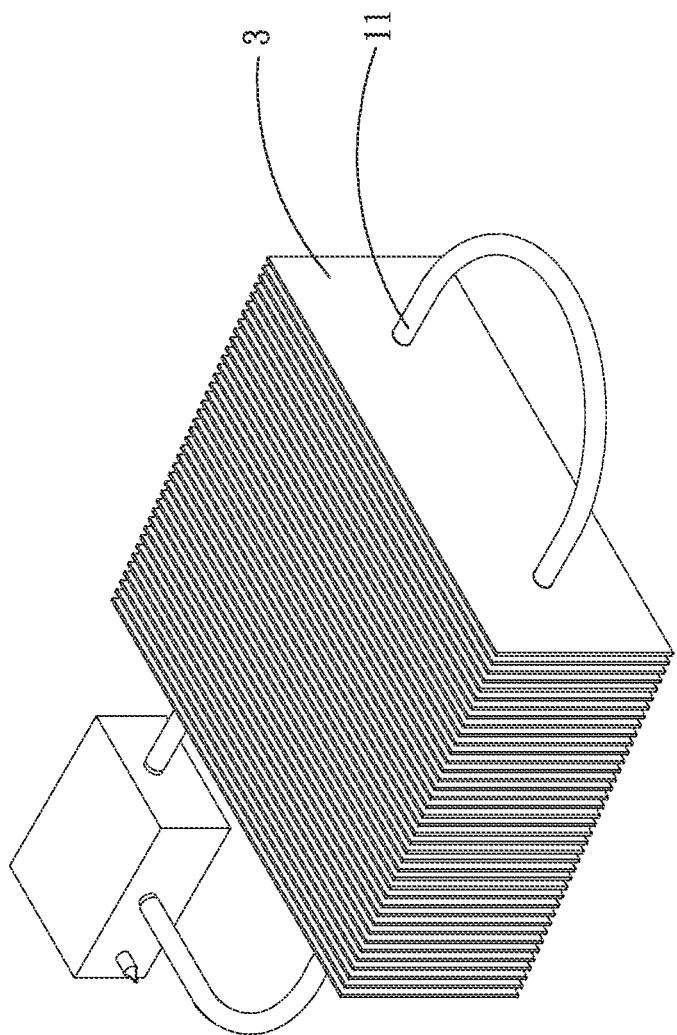
FIG. 6 is an assembled perspective view of a loop heat pipe structure according to a third embodiment of the present invention.

Please refer to FIG. 6 that is a perspective view of a loop heat pipe structure according to a third embodiment of the present invention. As shown, the third embodiment is generally structurally similar to the first embodiment, except that, in the third embodiment, the transport pipe 11 is extended through a plurality of radiating fins 3.

Figure 7:
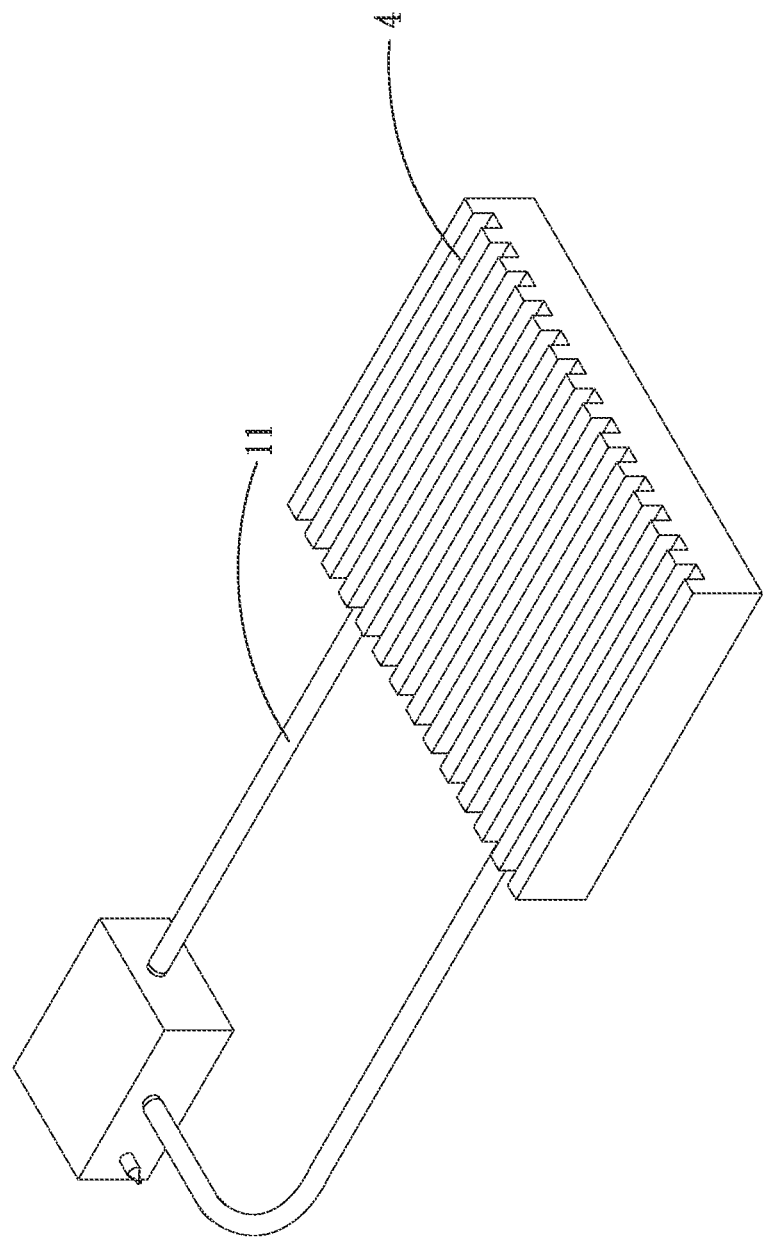
FIG. 7 is an assembled perspective view of a loop heat pipe structure according to a fourth embodiment of the present invention.

FIG. 7 is a perspective view of a loop heat pipe structure according to a fourth embodiment of the present invention. As shown, the fourth embodiment is generally structurally similar to the first embodiment, except that, in the fourth embodiment, the transport pipe 11 is extended through a condensing device 4.

Figure 8:
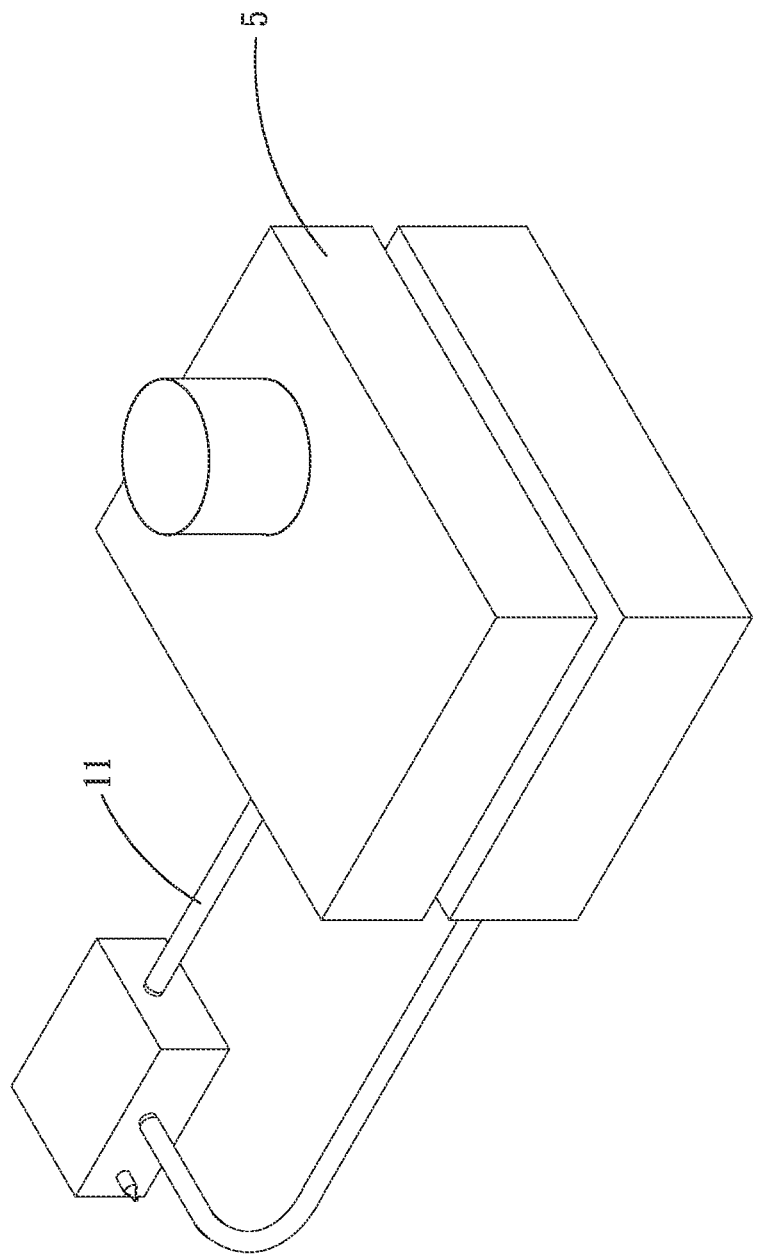
FIG. 8 is an assembled perspective view of a loop heat pipe structure according to a fifth embodiment of the present invention.

FIG. 8 is a perspective view of a loop heat pipe structure according to a fifth embodiment of the present invention. As shown, the fifth embodiment is generally structurally similar to the first embodiment, except that, in the fifth embodiment, the transport pipe 11 is extended through a water-cooling device 5.

Please refer to FIGS. 1 through 6. In practical implementation of the loop heat pipe structure 1, the first wick layer 121 has an effective capillary radius smaller than that of the second wick layer 122, and has thermal conductivity higher than that of the second wick layer 122. With this design, the first and the second chamber 123, 124 in the evaporator 12 can have increased thermal resistance, the pressure loss caused by the movement of the working fluid 2 through the second wick layer 122 is reduced, and the second wick layer 122 can serve as a heat lock layer to effectively prevent the heat in the first wick layer 121 from entering into the second chamber 124 to cause heat leak. That is, the working fluid 2 will not be overheated to form vapor-liquid phase equilibrium and produce high saturation vapor pressure in the second chamber 124, and the liquid-phase working fluid 2 in the transport pipe 11 would not be stopped from returning to the second chamber 124. Therefore, the above-described first and second wick layers 121, 122 can provide sufficient capillary force required by the whole loop heat pipe structure 1 to work normally under both standard and no-gravity conditions with reduced local thermal resistance.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A loop heat pipe structure, comprising:
   a transport pipe having a first end and a second end, and internally defining a flow passage communicating with the first and the second end;
   an evaporator having a first chamber and a second chamber adjoining the first chamber, the first chamber and the second chamber having a common bottom comprising a bottom plate, and having a working fluid filled therein; the first chamber having a first coupling hole coupled with the first end of the transport pipe; and the second chamber having a second coupling hole coupled with the second end of the transport pipe;
   a first wick layer located substantially in the second chamber atop the bottom and extending minimally into the first chamber, the first chamber being generally wick-free;
   a second wick layer being located atop and covering the first wick layer;
   wherein the first wick layer has an effective capillary radius smaller and a thermal conductively higher than those of the second wick layer
   a plurality of grooves being provided under the first wick layer; and wherein the second wick layer does not extend beyond the first wick layer into the first chamber;
   a partition extending from a top of the evaporator to the second wick layer and separating the first chamber and the second chamber to form two distinct chambers wherein the only direct passage for the working fluid between the second chamber and the adjoining first chamber in the evaporator is through the wick layers;
   wherein the first coupling hole is an outlet to carry the working fluid away from the evaporator, and the second coupling hole is an inlet for returning the working fluid into the evaporator; and
   wherein the evaporator includes a cover and said bottom plate correspondingly closed to each other to define the first and the second chamber therebetween; the first and the second wick layer being provided on the bottom plate, and the grooves being selectively provided on any one of the first wick layer and the bottom plate of the evaporator.

2. The loop heat pipe structure as claimed in claim 1, wherein the transport pipe is selectively communicably provided on any one of the first and the second chamber.

3. The loop heat pipe structure as claimed in claim 1, wherein the first and the second wick layer are selected from the group consisting of sintered powder bodies, net-like bodies, carbon fibers, and graphite.

4. The loop heat pipe structure as claimed in claim 1, wherein the transport pipe is extended through a plurality of radiating fins.

5. The loop heat pipe structure as claimed in claim 1, wherein the cover and the bottom plate are selectively made of different materials or identical material.

6. The loop heat pipe structure as claimed in claim 1, wherein the cover is made of a material selected from the group consisting of a stainless steel material, a carbon steel material, and a polymeric material.

7. The loop heat pipe structure as claimed in claim 1, wherein the second wick layer has permeability larger than that of the first wick layer.

8. The loop heat pipe structure as claimed in claim 1, wherein the transport pipe is extended through a condensing device.

9. The loop heat pipe structure as claimed in claim 1, wherein the transport pipe is extended through a water-cooled device.

* * * * *